(12) United States Patent
Jensen

(10) Patent No.: US 7,903,772 B2
(45) Date of Patent: Mar. 8, 2011

(54) DIGITAL DEMODULATOR WITH IMPROVED HARDWARE AND POWER EFFICIENCY

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 1322 days.

(21) Appl. No.: 11/051,580

(22) Filed: Feb. 4, 2005

(65) Prior Publication Data

US 2006/0176989 A1 Aug. 10, 2006

(51) Int. Cl.
*H04B 1/10* (2006.01)

(52) U.S. Cl. ......... 375/350; 375/229; 375/316; 375/324; 329/372

(58) Field of Classification Search ................... 375/350, 375/316, 229, 324; 329/372
See application file for complete search history.

(56) References Cited

U.S. PATENT DOCUMENTS

| | | | | |
|---|---|---|---|---|
| 4,425,665 A * | 1/1984 | Stauffer | ....................... | 375/223 |
| 5,550,869 A * | 8/1996 | Gurantz et al. | ................ | 375/340 |
| 5,619,542 A * | 4/1997 | Gurney et al. | ................ | 375/371 |
| 5,721,756 A * | 2/1998 | Liebetreu et al. | ............. | 375/344 |
| 5,995,563 A * | 11/1999 | Ben-Efraim et al. | ......... | 375/344 |
| 6,005,901 A * | 12/1999 | Linz | ................................ | 375/355 |
| 6,263,354 B1 * | 7/2001 | Gandhi | ......................... | 708/320 |
| 6,310,566 B1 * | 10/2001 | McNeely | ....................... | 341/123 |
| 6,434,192 B1 * | 8/2002 | Aizawa et al. | ................ | 375/232 |
| 6,912,259 B1 * | 6/2005 | Tsumura | ....................... | 375/354 |
| 2002/0181614 A1 * | 12/2002 | Mostafa et al. | ................ | 375/316 |
| 2003/0204542 A1 * | 10/2003 | Mueller | ......................... | 708/290 |
| 2004/0160346 A1 * | 8/2004 | Husted et al. | ................... | 341/61 |

* cited by examiner

*Primary Examiner* — Mohammad H Ghayour
*Assistant Examiner* — Leila Malek
(74) *Attorney, Agent, or Firm* — Garlick Harrison & Markison; Holly L. Rudnick

(57) ABSTRACT

A demodulator for use in a receiver converts a digital baseband signal into inbound digital symbols with reduced hardware complexity and reduced power consumption. The demodulator includes a lowpass filter operably coupled to filter the digital baseband signal to produce a filtered digital baseband signal, and an equalizer operating at a first sampling rate to equalize the frequency response of the digital baseband signal such that the receiver overall in-band frequency response approximates the frequency response of a square root raised cosine filter to produce an adjusted digital baseband signal. An interpolator receives the adjusted digital baseband signal at the first sampling rate and interpolates the adjusted digital baseband signal to produce an interpolated digital baseband signal at a second sampling rate, from which the inbound digital symbols can be generated.

21 Claims, 13 Drawing Sheets

DIGITAL DEMODULATOR WITH IMPROVED HARDWARE AND POWER EFFICIENCY

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage demodulates the filtered signal to recover the raw data in accordance with the particular wireless communication standard.

The most widespread communication standard in the area of wireless personal area networks (PANs) is currently Bluetooth. This communication standard employs Gaussian minimum shift keying (GMSK), which is a constant-envelope binary frequency shift keying (FSK) modulation scheme allowing raw transmission at a maximum rate of 1 Megabits per second (Mbps). While standard Bluetooth is sufficient for voice services, future high-fidelity audio and data services demand higher data throughput rates. Higher data rates can be achieved in the specification of the Bluetooth Enhanced Data Rates (Bluetooth EDR) standard by selectively applying a 4-level or 8-level phase shift keying (PSK) modulation scheme. With these variable-envelope communication scheme options, the maximum bit rate is increased 4-fold or 8-fold, respectively, compared to standard Bluetooth, while the chosen pulse shaping, a square-root raised cosine filter with a roll-off factor of 0.4, ensures that the RF carrier bandwidth is the same as that of standard Bluetooth, allowing for the reuse of the RF frequency channels.

Square Root Raised Cosine (RRC) filters are popular in wireless transceivers since, as is well-known, provided the transmitter implements pulse shaping with an identical filter, the receiver can sample the transmitted signal without inter-symbol interference, and hence improve the resistance towards noise and interferers of the system. However, typically, it is not possible to implement an RRC filter directly in the receiver signal path. This is due to the fact that some amount of analog filtering in the receiver is needed prior to analog-to-digital conversion, and the fact that RRC filters require implementation of lengthy hardware in-efficient FIR filters with many multipliers. Instead, linear RX path equalizers are most often implemented in the receiver to "un-distort" the receiver signal path in such a way that the total combined filtering of the receiver over the signal bandwidth closely resembles that of an RRC filter, while still providing a hardware efficient solution.

A critical parameter of current PSK demodulator design is the computational complexity, specifically the number of multiplications, required to implement the equalization functions of the RX path equalizer. In general, the optimal sampling point of a signal is not known a-priori. Thus, in order to ensure that the demodulator has access to the optimal sampling point, the RX path equalizer output needs to be generated at finely spaced points in time. Typical over-sampling ratios required for high performance are 12 or 16. This, in turn, determines the computational complexity of the RX path equalizers. For example, an RX path equalizer may require 8 multiplications per output sample. Thus, operating the equalizer at 12 MHz requires a total of 192 million Mults/second. This arithmetic complexity is substantial and contributes to the fact that the PSK demodulator requires relatively large die area (hardware) and relatively large power consumption.

Therefore, a need exists for a hardware-efficient and power-efficient PSK demodulator design for use in receivers.

SUMMARY OF THE INVENTION

A demodulator for use in a receiver is provided that is capable of converting a digital baseband signal into inbound digital symbols with reduced hardware complexity and reduced power consumption. The demodulator includes a lowpass filter operably coupled to filter the digital baseband signal to produce a filtered digital baseband signal, and an equalizer operating at a first sampling rate to equalize the frequency response of the digital baseband signal such that the receiver overall in-band frequency response approximates the frequency response of a desired filter (e.g., a square root raised cosine filter) to produce an adjusted digital baseband signal. An interpolator receives the adjusted digital baseband signal at the first sampling rate and interpolates the adjusted digital baseband signal to produce an interpolated digital baseband signal at a second sampling rate. A vector de-rotator vector de-rotates the interpolated digital baseband signal at the second sampling rate to produce magnitude and phase information, which is used by a demodulation module to produce the inbound digital symbols.

More specifically, in one embodiment, the interpolator implements a cubic polynomial that generates interpolated sampled values from sequential sampled values of the adjusted digital baseband signal to produce the interpolated digital baseband signal.

In further embodiments, the interpolator includes a tapped delay line for receiving the sequential sampled values of the adjusted digital baseband signal and a clock signal at the first sampling rate. The tapped delay line outputs selected ones of the sequential sampled values at each clock of the clock signal to a signal derivative estimation module that produces derivative estimates of a data sequence based on the selected sequential sample values. A clamped cubic spine (CCS) coefficient calculation module produces coefficient values of the cubic polynomial based on the derivative estimates and buffered ones of the sequential sampled values. Based on the coefficient values, an evaluation module evaluates the cubic polynomial at fixed interpolation points to produce the interpolated digital baseband signal.

For example, in one embodiment, the fixed interpolated points include M binary weighted fractions of each of the coefficient values. The evaluation module includes a plurality of multiplexers, each for receiving an interpolation point signal and the M binary weighted fractions of one of the coefficient values. Each of the multiplexers outputs one of the M binary weighted fractions based on a value of the interpolation point signal.

In still a further embodiment, the demodulator includes a phase shift keying (PSK) demodulator, in which the first sampling rate is 3 MHz and the second sampling rate is 12 MHz. In addition, in still further embodiments, the lowpass filter is a decimation filter for receiving the digital baseband signal at a third sampling rate greater than the second sampling rate and producing the filtered digital baseband signal at the first sampling rate.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
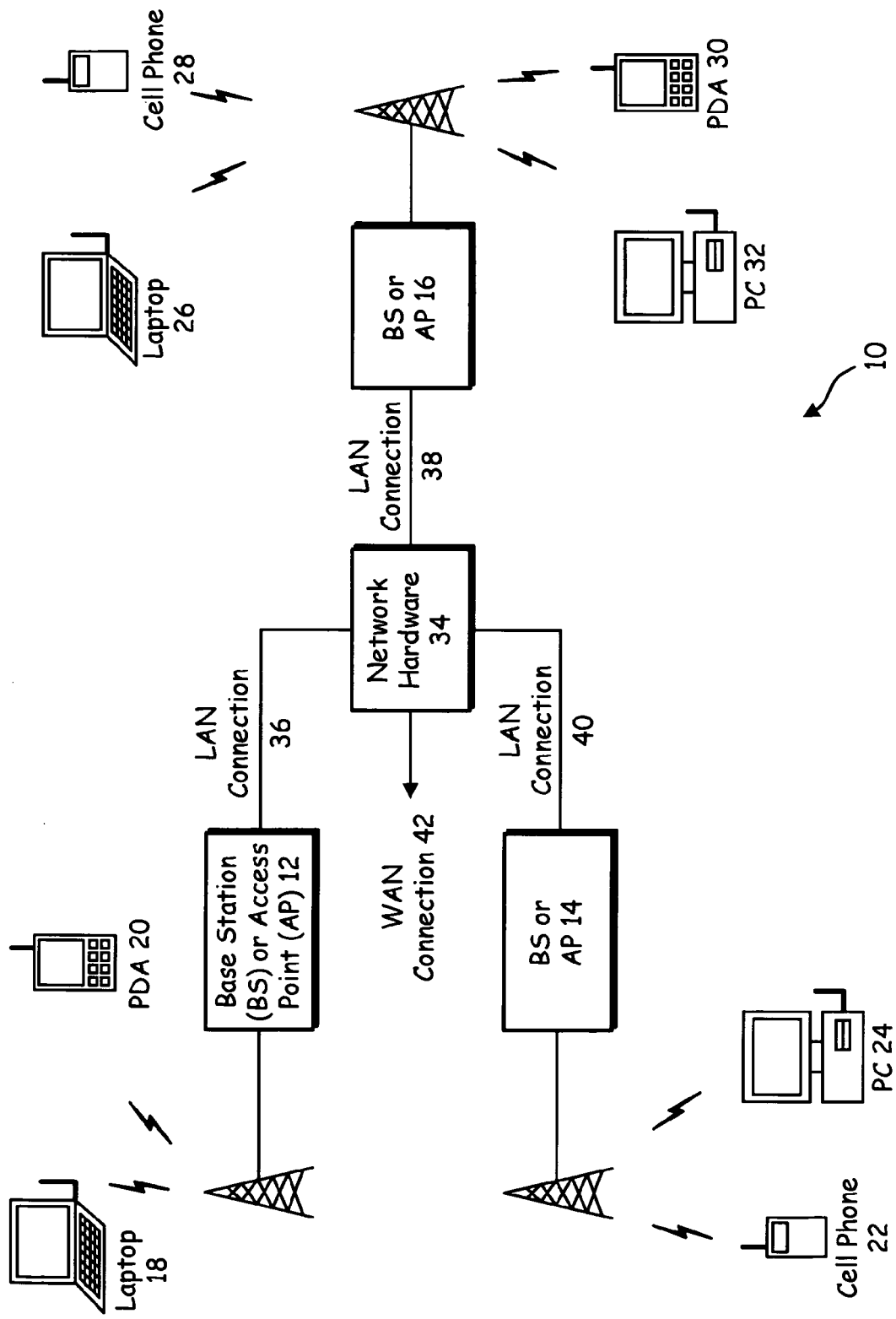
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. For example, access points are typically used in Bluetooth systems. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
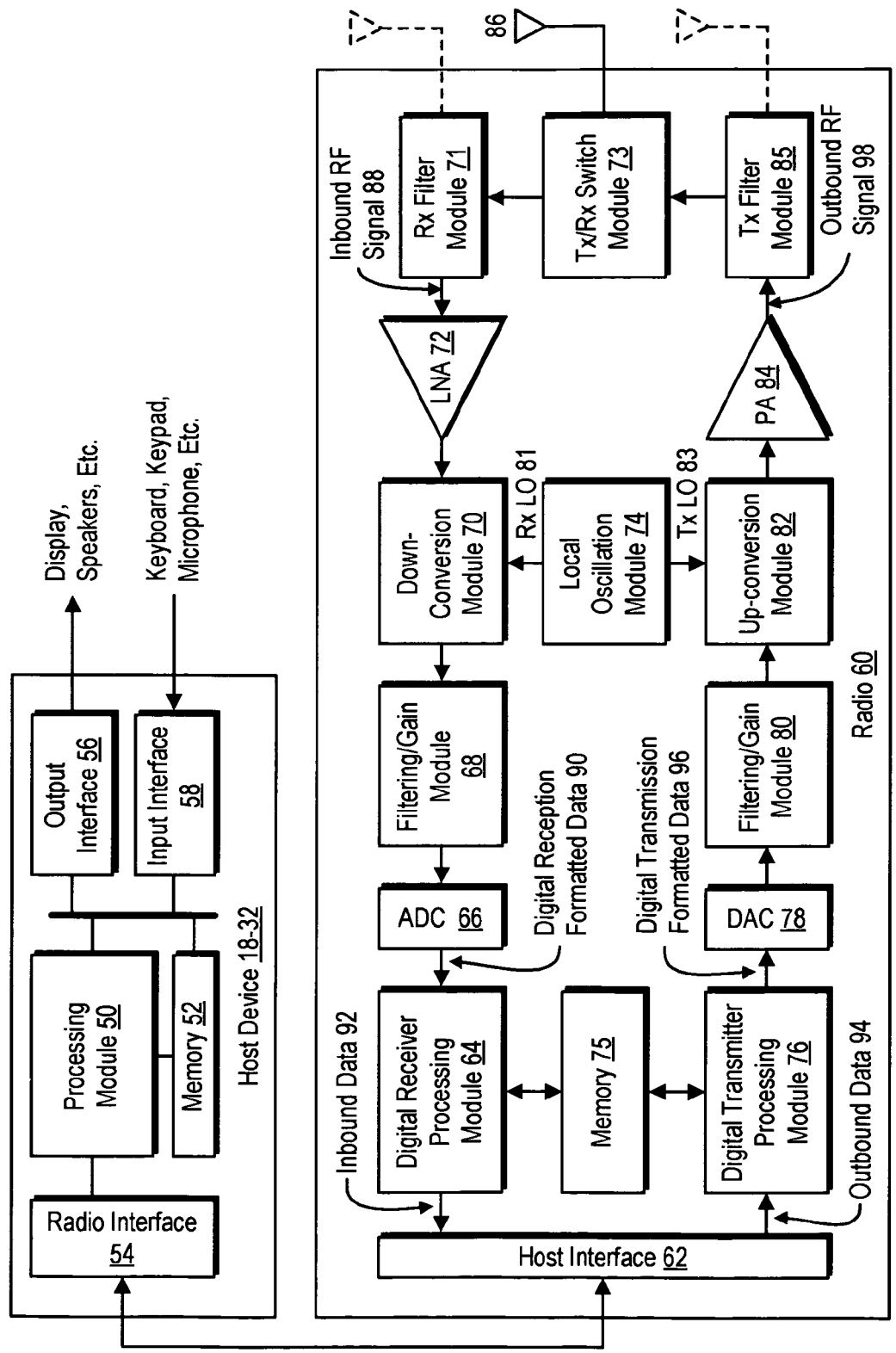
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a a low noise amplifier 72, receiver filter module 71, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, modulation. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for an up-conversion module 82 and a down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband/IF or RF by the up-conversion module 82 and down-conversion module 70, respectively. Accordingly, the local oscillation module 74 includes circuitry for adjusting an output frequency of a local oscillation signal provided therefrom. While one embodiment of the present invention includes local oscillation module 74, up-conversion module 82 and down-conversion module 70 that are implemented to perform conversion between a low intermediate frequency (IF) and RF, it is understood that the principles herein may also be applied readily to systems that implement a direct conversion between baseband and RF.

Figure 3:
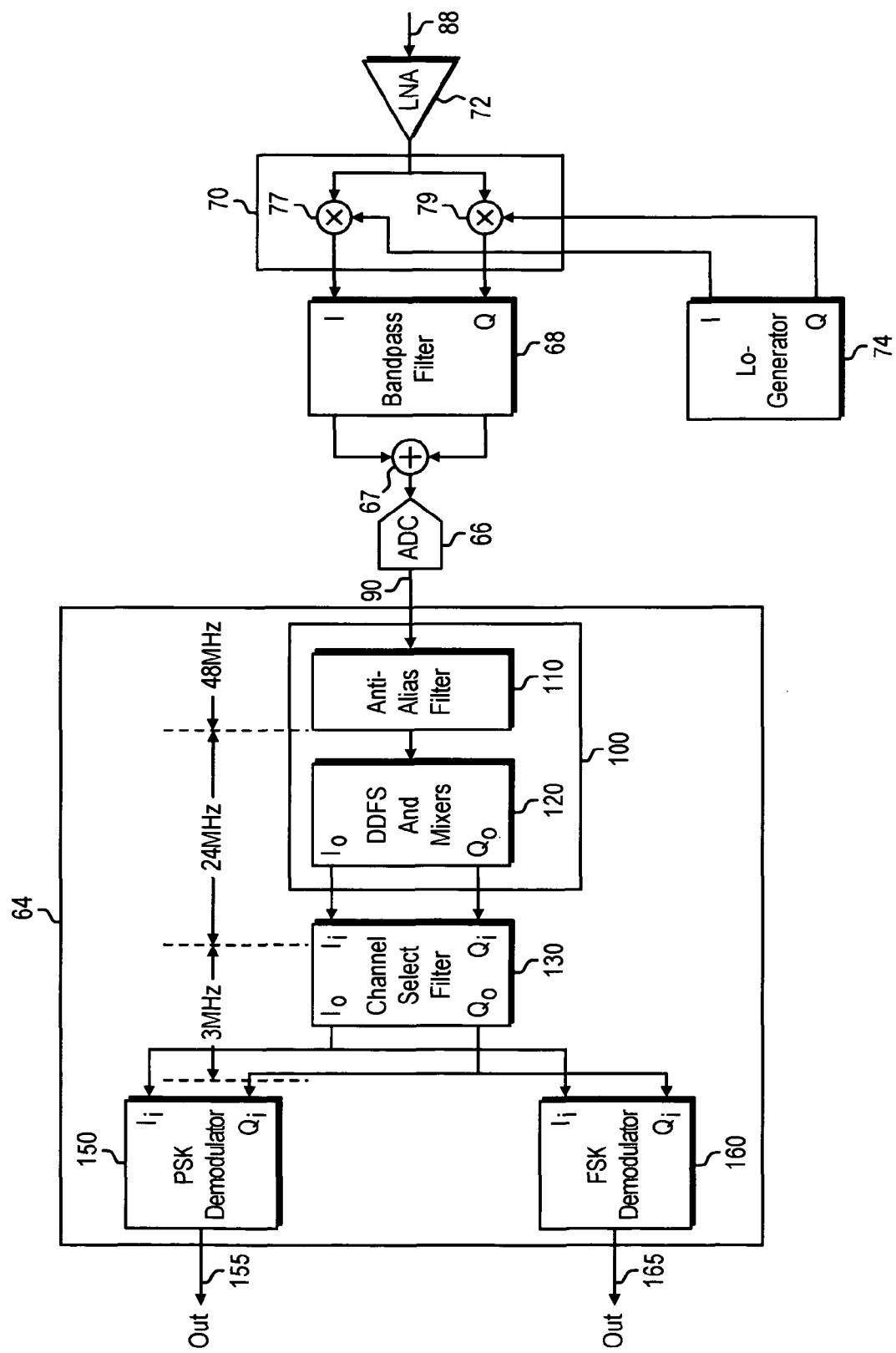
FIG. 3 is a schematic block diagram of a receiver section and digital demodulator of a radio transceiver in accordance with the present invention.

FIG. 3 is a schematic block diagram illustrating in more detail the receiver section of the radio 60 (shown in FIG. 2). As described above, the receiver section includes a low noise amplifier 72, a down conversion module 70, a bandpass filter (BPF) 68, a bandpass delta-sigma analog-to-digital converter (ΔΣADC) 66, and a digital demodulator 64. The down conversion module 70 includes mixers 77 and 79, and the BPF 68 is coupled to a summing module 67. In one embodiment, the BPF 68 is a third order Bessel-type poly-phase filter with a lowpass equivalent 3 dB-bandwidth of 750 kHz. The lowpass equivalent poles of such a filter are given in the following table and are specified in Radians/s:

| | | (1) |
|---|---|---|
| $p_0$ | $-6232962.864 + j0$ | |
| $p_1$ | $-4935799.388 + j4708922.718$ | |
| $p_2$ | $-4935799.388 - j4708922.718$ | |

From the above table, it can be seen that there is one real-valued pole and a pair of complex conjugate poles.

In operation, the low noise amplifier 72 amplifies the inbound RF signals 88 to produce amplified inbound RF signals and provides them to the down conversion module 70. The mixers 77 and 79 mix the amplified inbound RF signals with an in-phase and quadrature component of the receiver local oscillation 74, respectively. The outputs of mixers 77 and 79 are filtered by BPF 68, which may have a bandpass region of approximately 2 MHz. The BPF 68 provides low intermediate frequency (IF) signals to analog to digital converter module 66.

The analog-to-digital converter 66 converts the low IF signals from the analog domain to the digital domain to produce digital low IF signals 155 or 165. The digital demodulator 64 includes a baseband translation module 100, a filtering module 130, a Phase Shift Keying (PSK) demodulator 150 and a Frequency Shift Keying (FSK) demodulator 160. The baseband translation module 100 includes an anti-aliasing filter 110 and a direct digital frequency synthesizer (DDFS) and mixers module 120.

In operation, the anti-aliasing filter 110 receives the digital low IF signals and reduces the sampling rate of the digital low IF signals. For instance, for a Bluetooth Enhanced Data Rate Standard compliant receiver, the anti-aliasing filter 110 converts the radio of the digital low IF signals from 48 MHz to 24 MHz. The Direct Digital Frequency Synthesizer (DDFS) and mixers module 120 translates the reduced sampling rate digital low IF signals to baseband, or DC. For example, for a Bluetooth EDR Standard compliant receiver, the DDFS and mixers module 120 converts a digital low IF signals from the 2 MHz IF to DC.

The filtering module 130, which will be described in greater detail with reference to FIG. 4, may be a narrowband channel select filter that passes the desired signal and attenuates undesired interferers and noise. The output of the filtering module 130 may be delivered to the PSK demodulator 150 or the FSK demodulator 160, depending upon the mode of modulation. The purpose of the PSK demodulator 150 or FSK demodulator 160 is to "demodulate", or extract, the transmitted digital data from the modulated signal to produce PSK digital symbols 155 or FSK digital symbols 165, respectively.

In addition, in accordance with embodiments of the present invention, the filtering module 130 may be a decimation filter that reduces the sampling rate from 24 MHz to 3 MHz. In comparison with previous receiver systems whose output is traditionally produced at 12 MHz, the receiver channel select filter 130 of the present invention reduces the output by a factor of 8, which results in substantial hardware and power savings, as will be described in more detail below in connection with FIG. 4.

Figure 4:
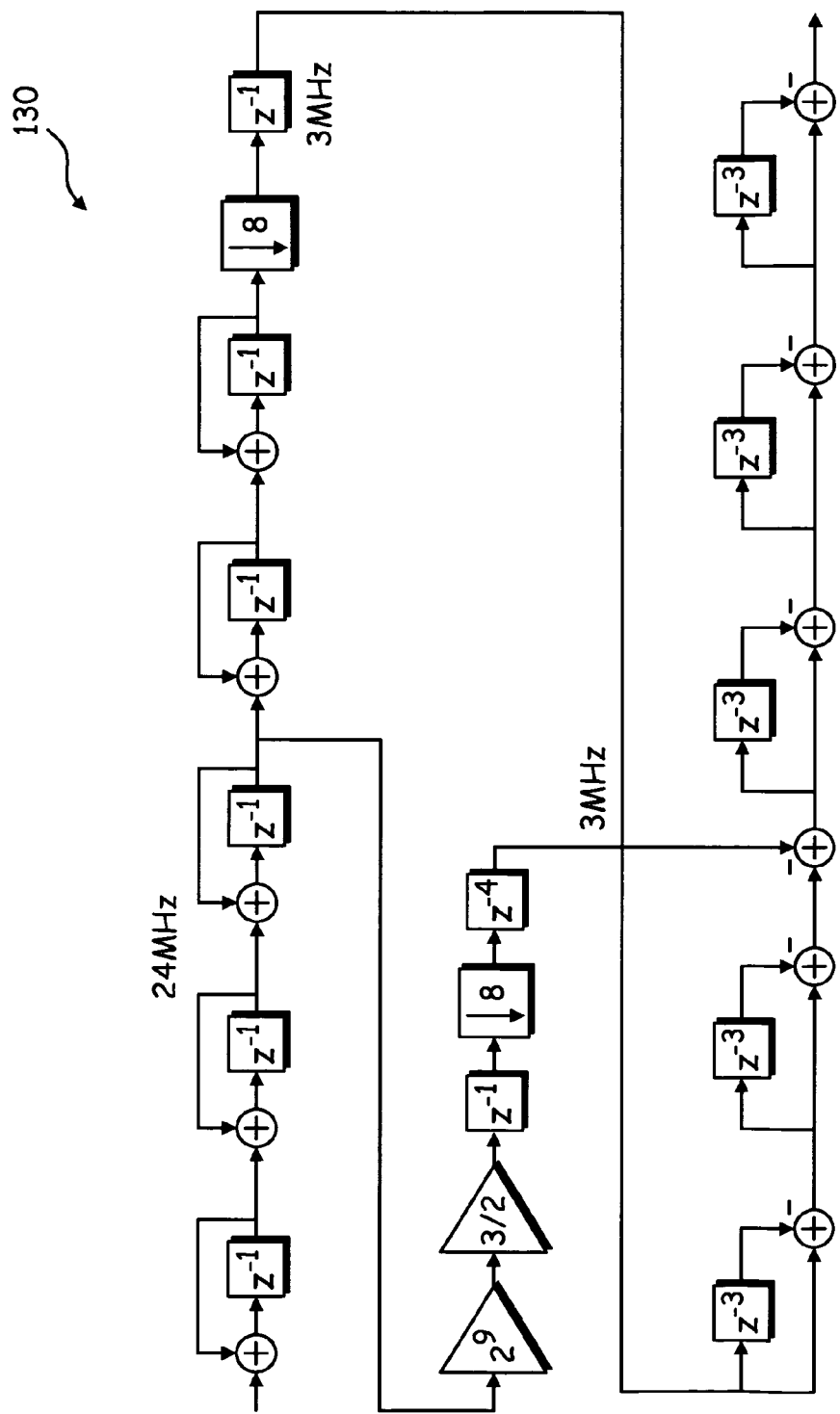
FIG. 4 is a schematic block diagram of a filter module of the digital demodulator in accordance with the present invention.

FIG. 4 is a schematic block diagram of an exemplary channel select filter module 130 of the digital demodulator 64. The channel select filter 130 shown in FIG. 4 is an example finite impulse response (FIR) filter with symmetric, real-valued coefficients. As the name implies, an FIR filter, H(z), can be represented in the discrete-time domain with a finite sequence of coefficients as in the following general form of the Z-transform of the impulse response $$H(z) = h_0 + h_1 z^{-1} + \ldots + h_N z^{-N} = \sum_{i=0}^{N} h_i z^{-i}, \quad (2)$$

Generally, it is undesirable to implement FIR filters in the direct form of Equation (2) because of the presence of multipliers in the transfer function. Multipliers require relatively large hardware complexity and consume relatively large amounts of power. Instead, as shown in FIG. 4, the channel select filter 130 may be implemented entirely without multipliers, requiring only adders and registers. Since the filter 130 is equivalent to a symmetric, real-coefficient FIR filter, the phase response of the filter 130 is linear. Equivalently, the group delay, defined as the negative of the derivative of the phase response w.r.t. frequency, is constant.

In FIG. 4, the filer delay lines (register files) are substantially shorter than the filter delay lines typically used in previous channel select filters, resulting in reduced hardware requirements. For example, in conventional channel select filters, the delay elements after downsampling typically have a value of $z^{-10}$. By contrast, as shown in FIG. 4, the delay elements after downsampling have a value of only $z^{-3}$. In addition, a major portion of the filter 130 is now operating at a sampling rate of 3 MHz as opposed to the 12 MHz sampling rate of previous channel select filters, resulting in substantially less power consumption.

Figure 5:
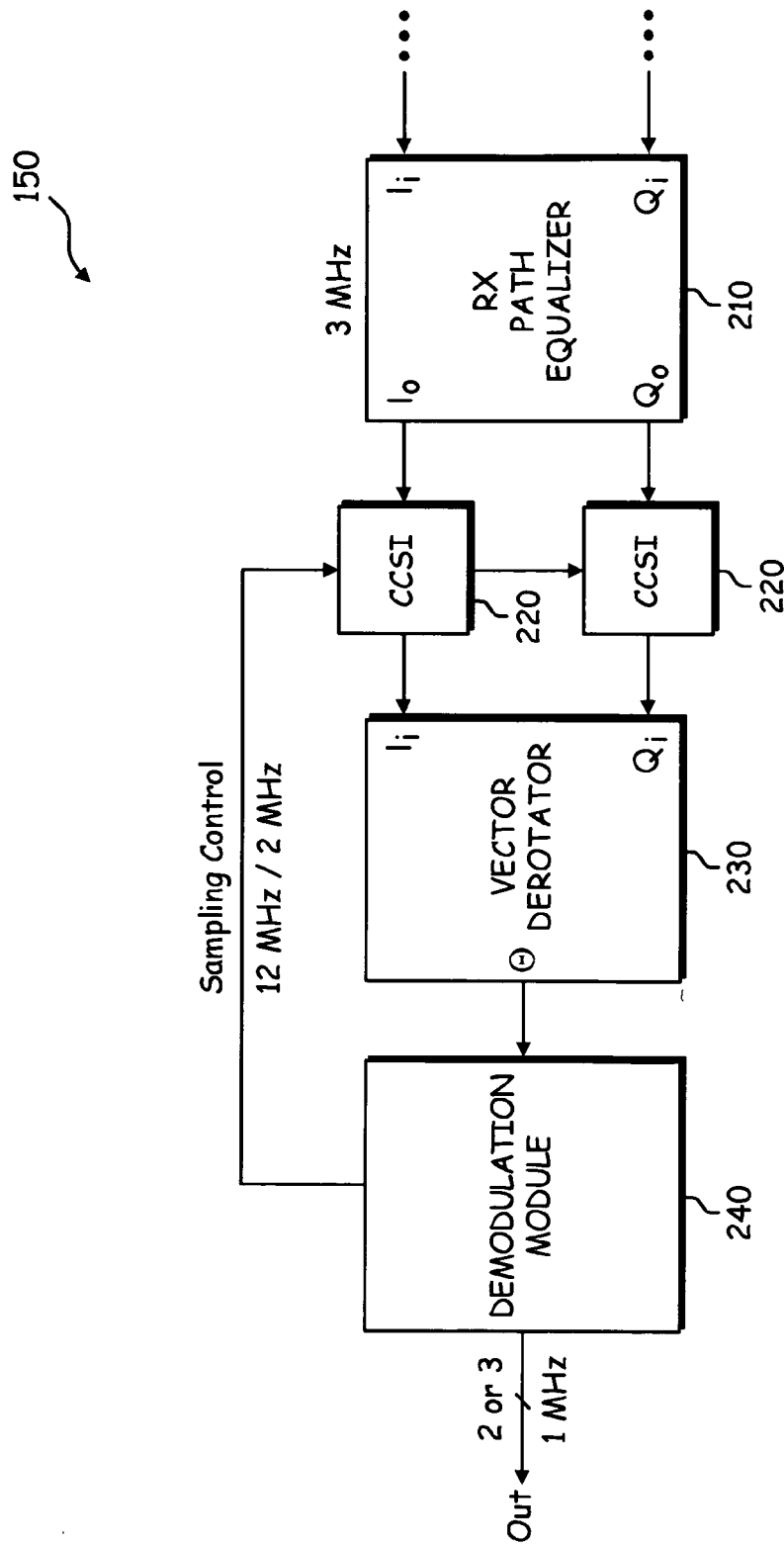
FIG. 5 is a schematic block diagram of a phase shift keying (PSK) digital demodulator in accordance with the present invention.
Figure 6:
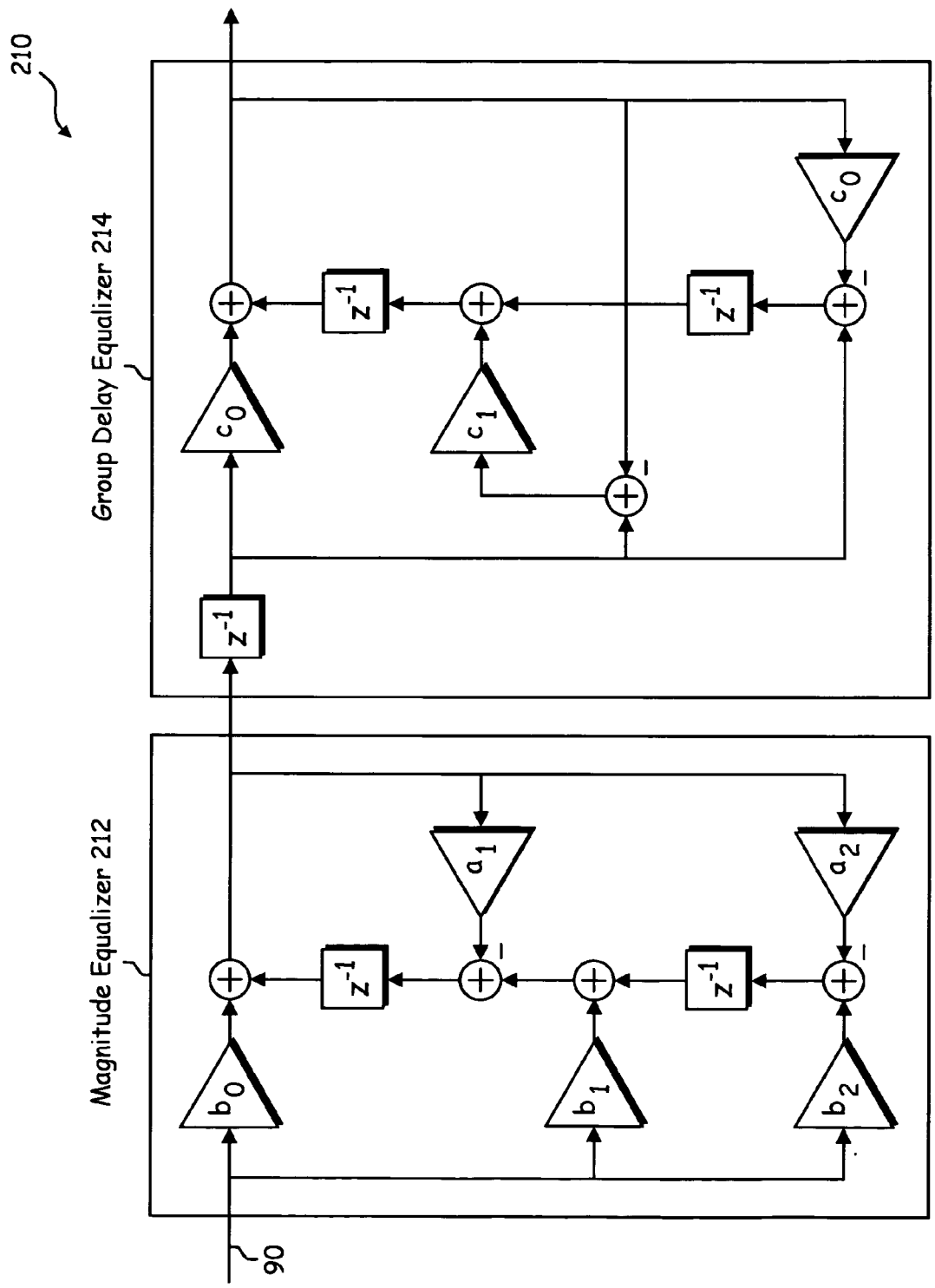
FIG. 6 is a schematic block diagram of an RX path equalizer in accordance with the present invention.

FIG. 5 is a schematic block diagram of an exemplary phase shift keying (PSK) digital demodulator in accordance with the present invention. The PSK digital demodulator 150 includes an equalizer 210, interpolators 220, a vector de-rotator module 230, and a demodulation module 240. The equalizer 210 includes a magnitude equalizer 212 and a group delay equalizer 214, as shown in FIG. 6. In accordance with embodiments of the present invention, the RX path equalizer 210 is operating at a sampling rate of 3 MHz. However, in general, the optimal sampling point of a signal is not known a-priori. Thus, in order to ensure that the demodulator has access to the optimal sampling point, the input to the demodulation module 240 must be generated at finely spaced points in time, e.g., at 12 or 16 MHz.

In order to achieve fine timing resolution for determining the optimal sampling point of the magnitude and group delay equalized signal, a non-linear filter operating as an interpolator 220 generates precisely interpolated signal values (e.g., 4 values) in-between the relatively coarsely sampled RX path equalizer output samples at 3 MHz, thereby effectively generating a 12-fold over-sampled signal. Once synchronization has been achieved, that is, the one phase (optimal sampling point) out of the twelve possible phases that yields the best constellation has been determined, the interpolator output sampling rate can be reduced to 2 MHz. Two samples per microsecond are needed to keep track of timing drift during the time it takes to receive the data portion of the packet. However, in other embodiments that do not include such a "timing track" feature, only one sample per microsecond (corresponding to a sample rate of 1 MHz) is needed. For example, acquisition of the optimal sampling point may occur after reception of a so-called "synchronization sequence," which is a known sequence of symbols that can be used to "lock" the receiver to the optimal sampling point.

As will be described in more detail below in connection with FIGS. 7-12, the interpolator 220 is highly hardware efficient, requiring only additions and shifts plus some simple control logic, and thus the overall hardware and power efficiency of the PSK demodulator 150 is thereby reduced drastically without sacrifice in performance. In one embodiment, the interpolator 220 is a clamped cubic spine interpolator (CCSI).

The vector de-rotator 230 de-rotates the in-coming complex signal defined by I,Q components onto the real axis, thereby producing the amplitude R and phase Θ of the complex signal. In one embodiment, the vector de-rotator module 230 is a COordinate Rotation DIgital Computer (CORDIC) module. The amplitude and phase information is delivered to the PSK demodulation module 240 for demodulation and extraction of the digital symbols.

FIG. 6 is a schematic block diagram of an embodiment of the RX path equalizer 210 that includes the magnitude equalizer 212 and the group delay equalizer 214. As shown, each of the equalizers 212 and 214 may be an infinite impulse response (IIR) filter. In one embodiment, the IIR filter is a fourth order infinite impulse response (IIR) filter that includes of a cascade of two second order IIR filters, also referred to as biquads. The first biquad 212 performs magnitude equalization, i.e., adjusts the RX signal path such that the magnitude response closely resembles that of an RRC filter with roll-off factor 0.4. The second biquad 214 performs group delay equalization, i.e., adjusts the phase response of the RX signal path such that it is approximately linear, or, equivalently, has constant group delay.

The transfer function of the magnitude equalizer 212 may be written as:

$$H_{ME}(z) = \frac{b_0 + b_1 z^{-1} + b_2 z^{-2}}{1 + a_1 z^{-1} + a_2 z^{-2}} \tag{3}$$

and the transfer function of the group delay equalizer 214 may be written as:

$$H_{GE}(z) = \frac{c_0 + c_1 z^{-1} + z^{-2}}{1 + c_1 z^{-1} + c_0 z^{-2}}, \tag{4}$$

where the filter coefficients are chosen such that the equalization function obtained yields an overall receiver frequency response that approximates a square root raised cosine filter for the Bluetooth EDR Standard. In order to best approximate the desired RX path equalizer magnitude response, the following coefficients are chosen for the magnitude equalizer 212 operating at a sampling rate of 12 MHz:

| | | (5) |
|---|---|---|
| $b_0$ | 1.22731514735647 | |
| $b_1$ | −2.21400838114118 | |
| $b_2$ | 1.02139302806670 | |
| $a_1$ | −1.76262869826090 | |
| $a_2$ | 0.79744737975766 | |

In addition, in order to best linearize the RX path phase response, the following coefficients are chosen for the group delay equalizer 214 operating at a sampling rate of 12 MHz:

| | | (6) |
|---|---|---|
| $c_0$ | 0.66840659624231 | |
| $c_1$ | −1.61215916930441 | |

In conventional PSK demodulators, the RX path equalizer 210 operates at a sampling rate of 12 MHz. As discussed above, such over-sampling is needed to ensure fine timing resolution of the PSK demodulation. However, the amount of over-sampling determines the computational complexity of the RX path equalizer 210. As can be seen in FIG. 6, the equalizer 210 requires 5+3=8 multiplications per output sample. Thus, operating the equalizer 210 at 12 MHz requires a total of:

$$[2 \times (5+3) \text{Mults}] \times 12 \text{ MHz} = 192 \text{ million Mults/sec} = 192 \text{ MMults/s}. \tag{7}$$

This arithmetic complexity is substantial and contributes to the fact that conventional PSK demodulators require relatively large die area (hardware) and relatively large power consumption.

However, in accordance with embodiments of the present invention, the IIR filters are clocked at 3 MHz, resulting in substantial reduction of the number of multiplication required for this processing task. Specifically, the equalizer 210 in FIG. 6 requires a total of:

$$[2 \times (5+3) \text{Mults}] \times 3 \text{ MHz} = 48 \text{ MMults/s}. \tag{8}$$

Thus, the number of multiplications required has been reduced 4-fold compared to Equation (7). The structure and operation of the RX path equalizer 210 has not been modified from that previously used in conventional PSK demodulators, only the sampling rate has been changed. However, in order to operate at 3 MHz, different filter coefficients are now needed to perform the signal equalization task. Specifically, the optimal filter coefficients for the magnitude equalizer 212 operating at 3 MHz are:

| | | (9) |
|---|---|---|
| b0 | 1.21155357328805 | |
| b1 | −1.36444108188034 | |
| b2 | 0.53680652146907 | |
| a1 | −0.91633714730334 | |
| a2 | 0.30143804055765 | | and the optimal filter coefficients for the group delay equalizer 214 operating at 3 MHz are:

| | | (10) |
|---|---|---|
| c0 | 0.23767535798677 | |
| c1 | −0.75670386301391 | |

Figure 7:
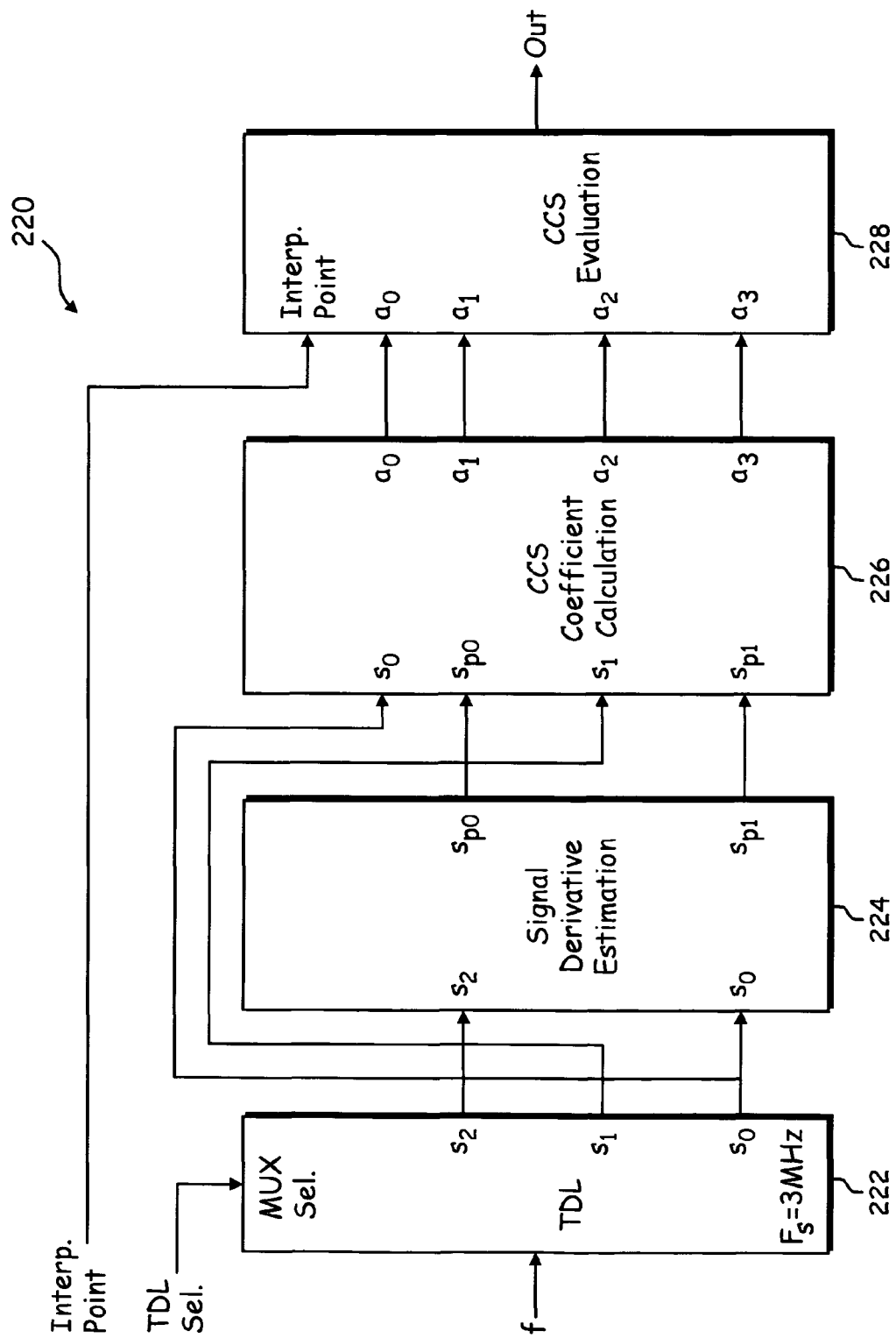
FIG. 7 is a functional block diagram of an interpolator that may be used in the PSK digital demodulator according to one embodiment of the present invention.

FIG. 7 is a functional block diagram of a CCSI that may be used as the interpolator 220 of FIG. 5, according to one embodiment of the present invention. The CCSI of FIG. 7 uses a high order polynomial function to estimate signal values based upon known end points (sample points) of a data stream. While the described embodiment implements a solution of the third order, it should be understood that other order solutions, such as a fourth order, or even a second order, may be implemented according to system requirements.

The CCSI 220 includes a tapped delay line (TDL) 222 clocked at 3 MHz, a Signal Derivative Estimation module 224, a CCS Coefficient Calculation module 226 and a CCS Evaluation module 228. The TDL 222 implements delay elements that allow for a capability to track optimal timing, since the timing may drift during transmission of a packet. The TDL 222 is coupled to receive sequential sampled values of a digital baseband signal produced by the RX path equalizer 210 (shown in FIG. 5), and output selected sampled values at each 3 MHz clock signal. The sequential sampled values are input to a MUX in the TDL 222. The selection is performed based on a value of a TDL selection control signal input to the MUX.

For example, as shown in FIG. 7, the sequential samples of the digital baseband signal are represented by $f(f_N, \ldots f_2, f_1, f_0)$, and the selected output samples are represented by $(s_2, s_1, s_0)$. The value of the TDL selection control signal determines which of the sequential samples in $f(f_N, \ldots f_2, f_1, f_0)$ is output as $(S_2, s_1 \text{ and } s_0)$. Initially, prior to acquisition of optimal timing, the selection of the MUX is such that MUX Sel=0, implying that $(s_2, s_1, s_0) = (f_2, f_1, f_0)$.

The derivative estimation module 224 is coupled to receive a pair of the selected sampled values ($s_2$ and $s_0$) and produce derivative estimates ($s_{p0}$ and $s_{p1}$) of a data sequence to the CCS coefficient calculation module 226. CCS coefficient calculation module 226 produces coefficient values of the cubic polynomial based on the derivative estimates ($s_{p0}$ and $s_{p1}$) produced by derivative estimation module 224 and a pair of buffered ones of the selected sampled values ($s_1$, and $s_0$). CCS evaluation module 228 evaluates the clamped cubic spline based upon the coefficient values produced by CCS coefficient calculation module 228 and a value of an interpolation point control signal, as will be described in more detail below in connection with FIGS. 11 and 12.

To further explain the functionality of the CCSI 220, in the described embodiment of the invention, logic circuitry performs a clamped cubic spline function of a cubic polynomial of the form:

$$f(x) = a_0 + a_1 x + a_2 x^2 + a_3 x^3, \tag{11}$$

where the coefficients $a_0, \ldots, a_3$ depend upon known values of the function and its derivatives in the boundary points $x_0$ and $x_1$, and where the interpolation point x (the point at which an estimate of the function value is desired) is in between the boundary points. For convenience, f(x) has here been defined such that $x \in [0; 1]$. Specifically, the coefficients of the CCS are defined by $$a_0 = f(x_0)$$

$$a_1 = f'(x_0)$$

$$a_2 = 3(f(x_1) - f(x_0)) - (f'(x_1) + 2f'(x_0))$$

$$a_3 = 2(f(x_0) - f(x_1)) + f'(x_1) + f'(x_0) \tag{12}$$

In the present application, the signal is generally unknown and hence the derivatives of the signal are not known a-priori. Thus, precise estimates of the signal derivatives in the boundary points in between the appropriate samples of the desired signal are generated by the derivative estimation module 224. Specifically, these derivatives are evaluated as $f'(x_0)$ and $f'(x_1)$, and are labeled "$s_{p0}$" and "$s_{p1}$", respectively. The CCS Coefficient Calculation module 226 then calculates the CCS coefficients, as defined by Equations (11) and (12). The evaluation of the polynomial in Equation (11) is performed by the CCS Evaluation module 228.

Figure 8:
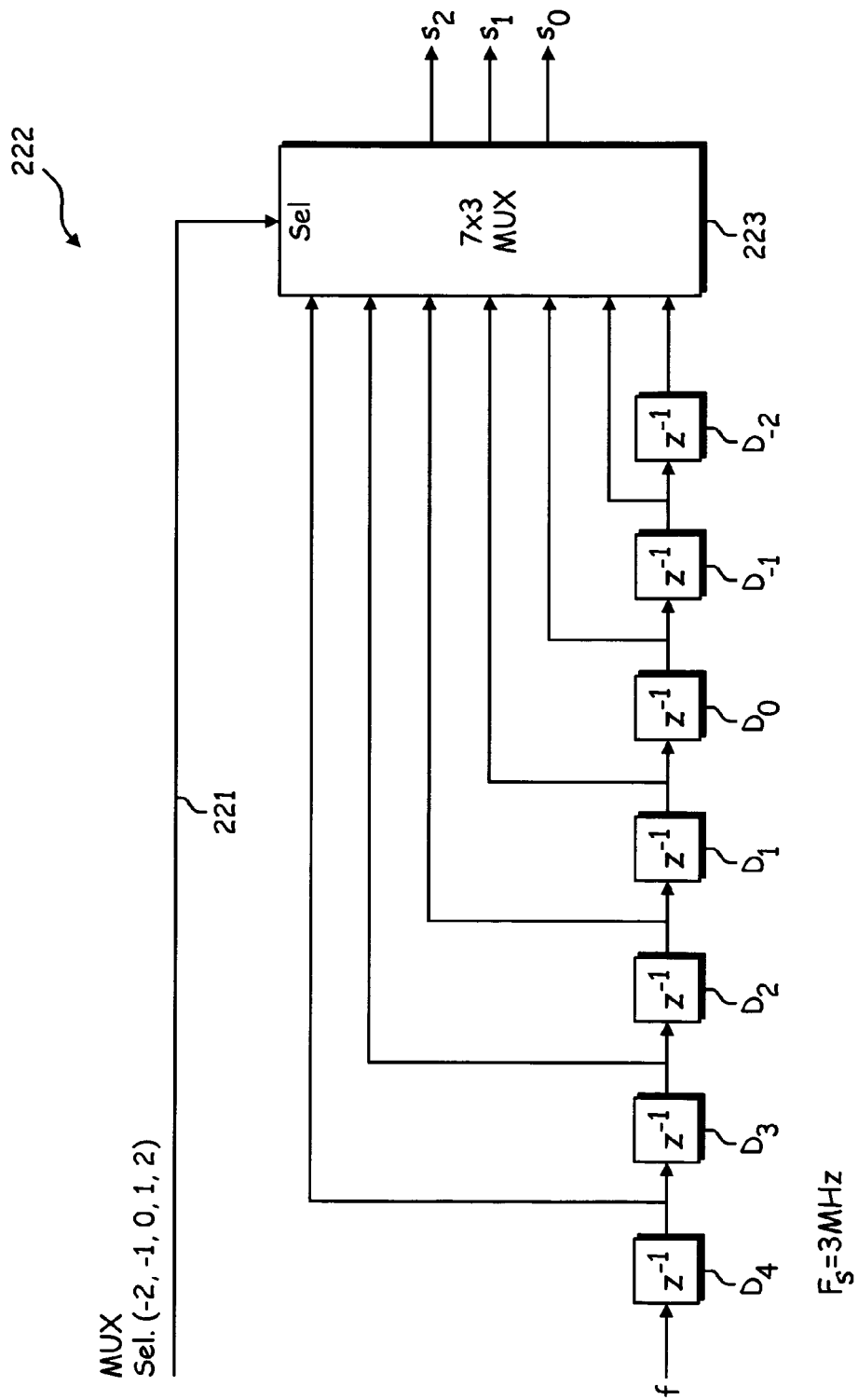
FIG. 8 shows details of a tapped delay line for use in the interpolator according to one embodiment of the present invention.

FIG. 8 shows details of an exemplary TDL module 222. The TDL module 222 includes a delay line with seven (7) registers and a 7×3 MUX 223. The particular signals multiplexed to the outputs, labeled $s_2$, $s_1$ and $s_0$, depend upon the value of the TDL selection control signal 221. Specifically, denoting the register output $D_{-2}, D_{-1}, \ldots, D_3, D_4$, the MUX operates according to:

$$(s_2, s_1, s_0) = \begin{cases} (D_{-2}, D_{-1}, D_0), & \text{if } Sel = -2 \\ (D_{-1}, D_0, D_1), & \text{if } Sel = -1 \\ (D_0, D_1, D_2), & \text{if } Sel = 0 \\ (D_1, D_2, D_3), & \text{if } Sel = 1 \\ (D_2, D_3, D_4), & \text{if } Sel = 2 \end{cases} \tag{13}$$

Figure 9:
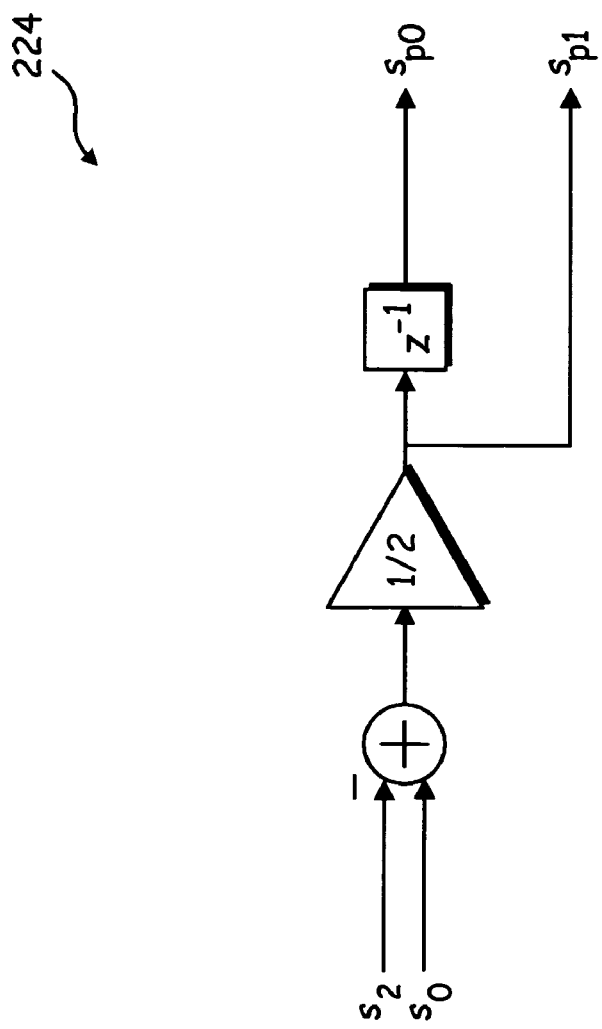
FIG. 9 shows details of a signal derivation estimation module for use in the interpolator according to one embodiment of the present invention.

FIG. 9 shows the details of an exemplary embodiment of the derivative estimation module 224 of FIG. 7. The pair of selected sampled values ($s_2$ and $s_0$) are input to a subtraction node and the resulting difference signal is input to a multiplier (½), whose output includes derivative estimate $s_{p1}$ and delayed derivative estimate $s_{p0}$.

Figure 10:
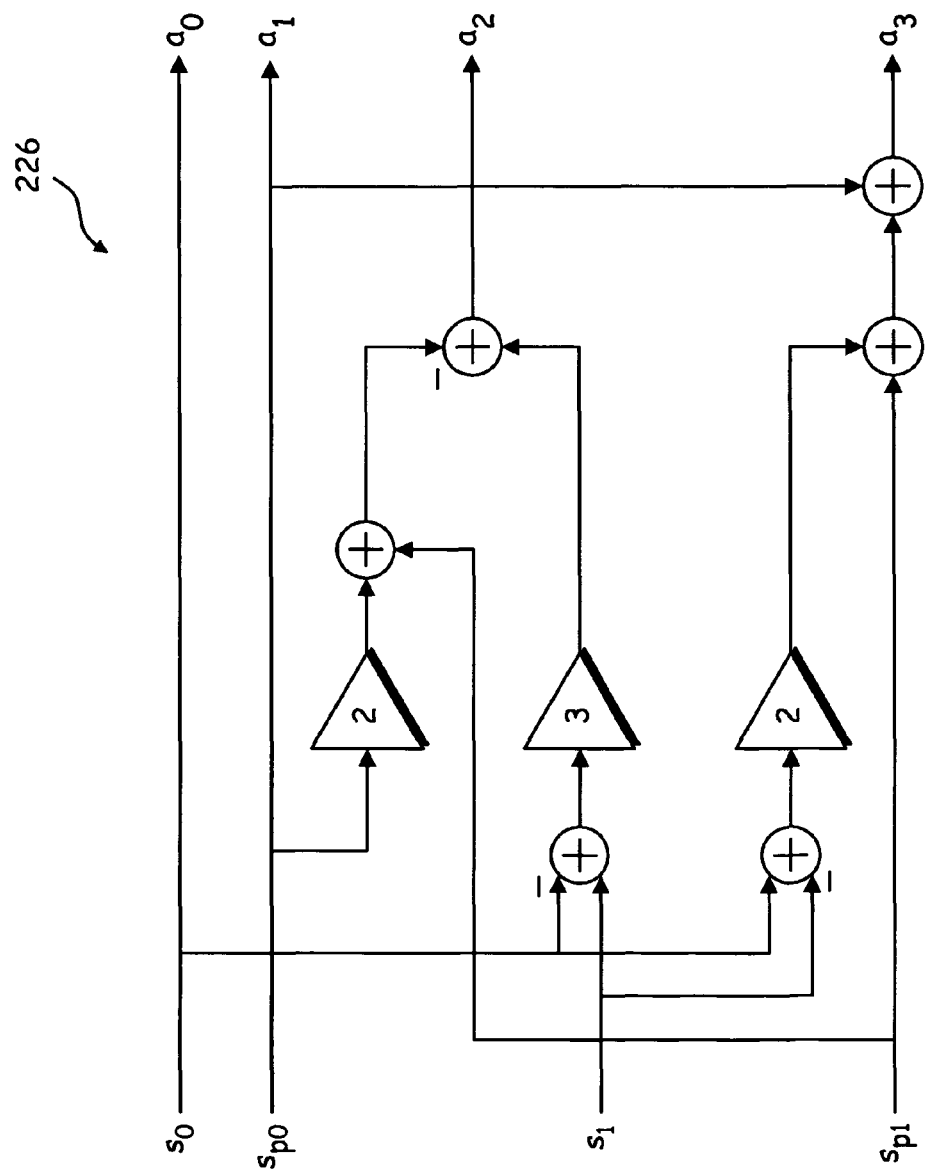
FIG. 10 shows details of a CCS coefficient calculation module for use in the interpolator according to one embodiment of the present invention.

FIG. 10 shows the details of an exemplary CCS coefficient calculation module 226. The arithmetic indicated in this figure directly follows from Equation 12. It should be noted that factors of 2 and 3 are implemented as a left-shift and a left-shift and add, respectively, to achieve the functionality of multiplication but are not actual multiplication operations.

Figure 11:
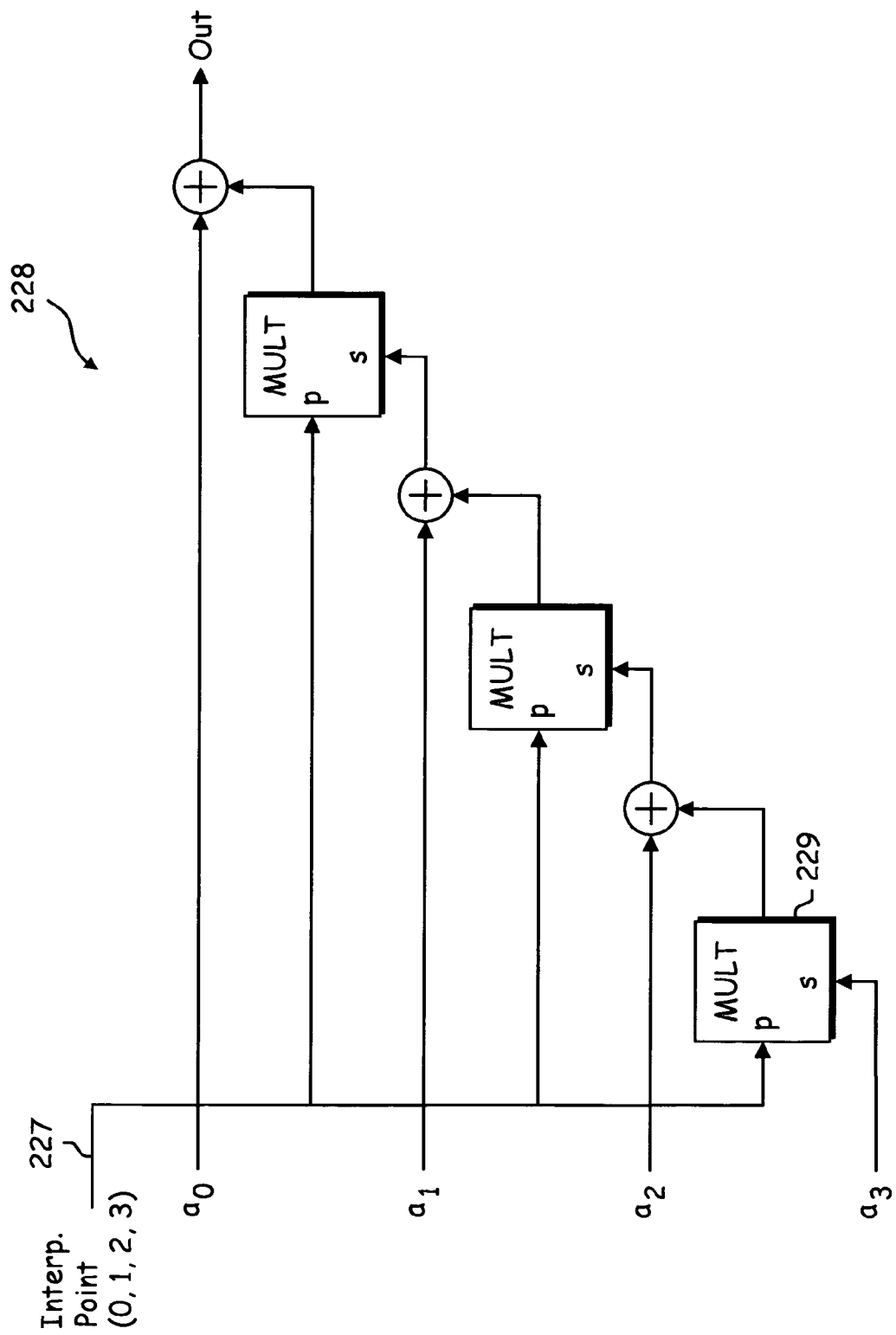
FIG. 11 is a functional schematic diagram that shows details of a CCS evaluation module according to one embodiment of the present invention.

FIG. 11 is a functional schematic diagram that shows the details of an exemplary CCS evaluation module 228 of FIG. 7. The method of polynomial evaluation adopted here is referred to as Homer's method. This method follows directly from Equation (11) by noting that the cubic polynomial may be rewritten as:

$$f(p) = a_0 + a_1 p + a_2 p^2 + a_3 p^3 = a_0 + p(a_1 + p(a_2 + pa_3)) \quad (14)$$

The advantages of Homer's method are a reduced number of multiplications necessary to evaluate the polynomial and typically more well balanced intermediate signal swings.

Figure 12:
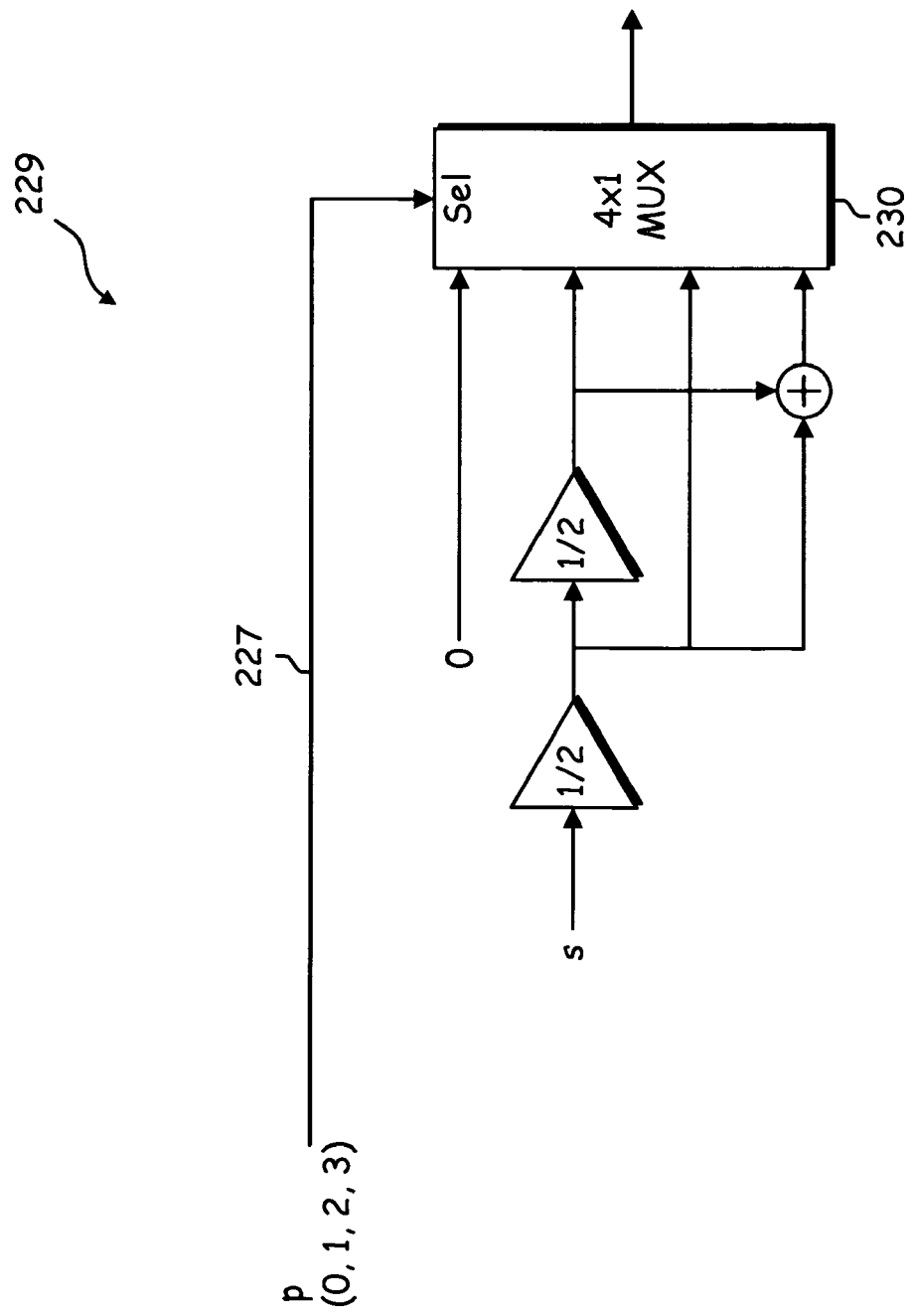
FIG. 12 shows details of a multiplier for use in the CCS evaluation module according to one embodiment of the present invention.

In general, for arbitrary interpolation points p, Equation (14) requires three multiplications, as indicated by the MULT blocks 229 in FIG. 11. However, by restricting the interpolation points to be binarily weighted fractions, multiplications can be avoided. This is shown in FIG. 12, where the possible interpolation points are (0, 0.25, 0.50, and 0.75), corresponding to the interpolation point control signal (p) 227=(0,1,2,3), respectively. In such a case, the MULT function can be implemented with a MUX 229 that chooses one of four different possible output values, (0, 0.25 s, 0.50 s, and 0.75 s), corresponding to p=(0,1,2,3), respectively.

It should be noted that for each fixed interpolation point p, the CCSI 220 may be viewed as an FIR filter operating at a sampling rate of 3 MHz. It can be shown that the FIR equivalent impulse responses are given by:

$$p=0: H(z) = z^{-2}$$

$$p=1: H(z) = -0.0234375 + 0.2265625 z^{-1} + 0.8671875 z^{-2} - 0.0703125 z^{-3}$$

$$p=2: H(z) = -0.0625 + 0.5625 z^{-1} + 0.5625 z^{-2} - 0.0625 z^{-3}$$

$$p=3: H(z) = -0.0703125 + 0.8671875 z^{-1} + 0.2265625 z^{-2} - 0.0234375 z^{-3}$$

Thus, an a-priori estimate of the performance of the CCSI 220 can be obtained by considering the magnitude and group delay responses of the above four FIR filters. In testing, the magnitude and group delay responses of the four FIR filters was highly flat over the signal band 0-0.5 MHz. Therefore, a CCSI 220 designed in accordance with exemplary embodiments of the present invention should perform excellently as an interpolator for the PSK demodulator.

Figure 13:
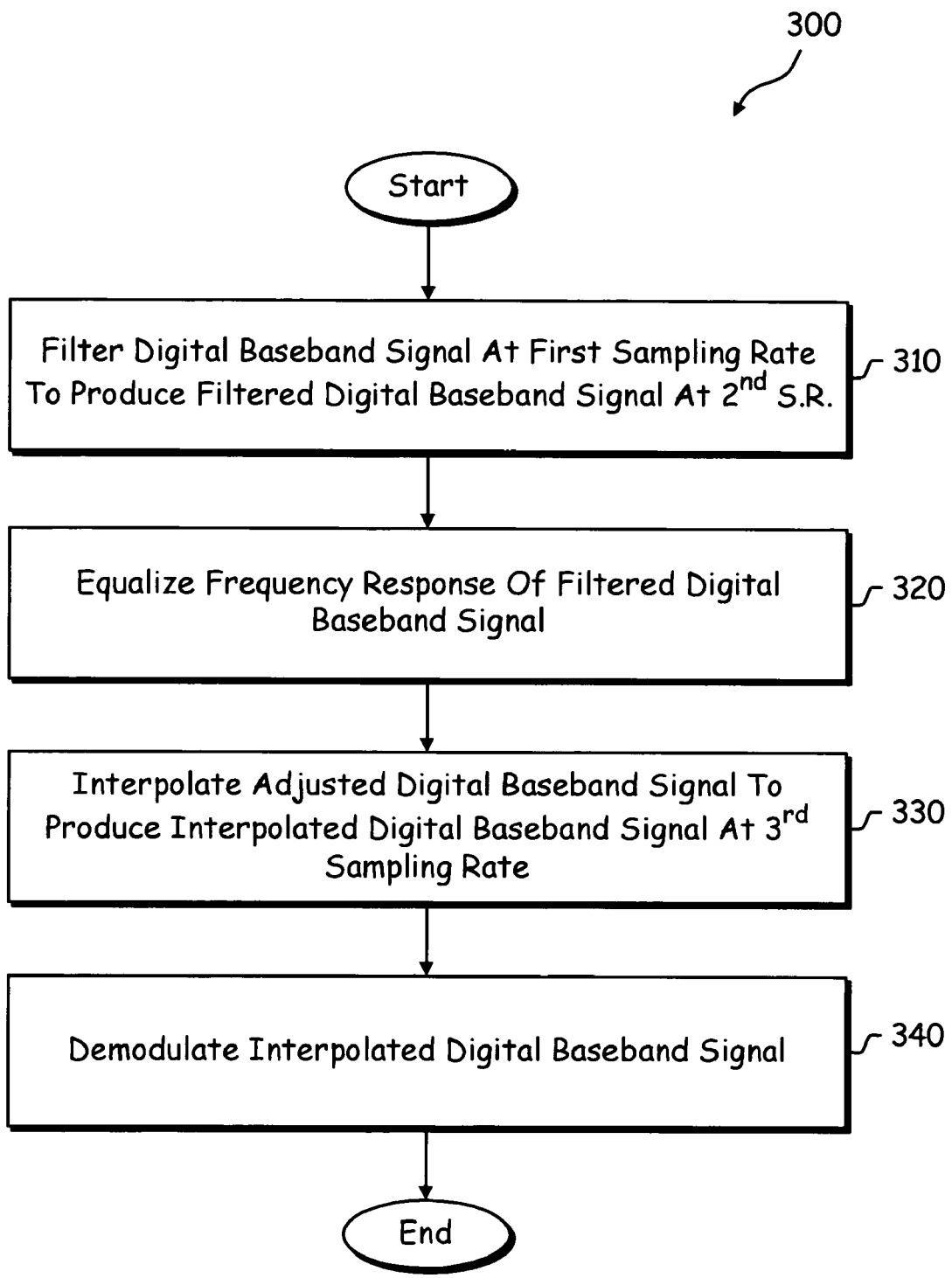
FIG. 13 is a flowchart illustrating one method of the present invention.

FIG. 13 is a flowchart illustrating one method 300 of the present invention for converting a digital baseband signal into inbound digital symbols. Initially, the digital baseband signal is input to the channel select filter at a first sampling rate (e.g., 24 MHz), where it is filtered to produce a filtered digital baseband signal at a second sampling rate (e.g., 3 MHz), which is less than the first sampling rate (step 310). Thereafter, the frequency response of the filtered digital baseband signal is equalized such that the overall in-band frequency response approximates the frequency response of a desired filter (e.g., a square root raised cosine filter) to produce an adjusted digital baseband signal (step 320).

The adjusted digital baseband signal is interpolated to produce an interpolated digital baseband signal at a third sampling rate (e.g., 12 MHz), which is greater than the first sampling rate and less than the first sampling rate (step 330). However, once the optimal sampling point has been determined (synchronization has occurred), the interpolator output sampling rate can be reduced to 2 MHz or 1 MHz, as described above. The interpolated digital baseband signal is demodulated to produce the inbound digital symbols (step 340).

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A demodulator for use in a receiver to convert a digital baseband signal into inbound digital symbols, the demodulator comprising:

a lowpass filter for filtering the digital baseband signal to produce a filtered digital baseband signal;

an equalizer operating at a first sampling rate to equalize a frequency response of the digital baseband signal such that the receiver overall in-band frequency response approximates the frequency response of a desired filter to produce an adjusted digital baseband signal;

an interpolator for receiving the adjusted digital baseband signal at the first sampling rate and interpolating the adjusted digital baseband signal to produce an interpolated digital baseband signal at a second sampling rate;

a vector de-rotator for vector de-rotating the interpolated digital baseband signal at the second sampling rate to produce magnitude and phase information; and a demodulation module for producing the inbound digital symbols from the magnitude and phase information;

wherein the interpolator includes a tapped delay line coupled to receive sequential sampled values of the adjusted digital baseband signal and a clock signal at the first sampling rate, wherein the tapped delay line outputs selected ones of the sequential sampled values at each clock of the clock signal;

wherein the tapped delay line includes M delay elements sequentially coupled, each having a respective tap on an output thereof, wherein the tapped delay line further includes a single M×N multiplexer coupled to the tap of each of the M delay elements and coupled to receive a control signal, the multiplexer producing the output of N of the M delay elements based upon a value of the control signal as the selected sequential sampled values.

2. The demodulator of claim 1, wherein the demodulator includes a phase shift keying (PS K) demodulator.

3. The demodulator of claim 1, wherein the vector de-rotator is a coordinate rotation digital computer (CORDIC) module.

4. The demodulator of claim 1, wherein the interpolator implements a cubic polynomial that generates interpolated sampled values from the sequential sampled values of the adjusted digital baseband signal to produce the interpolated digital baseband signal.

5. The demodulator of claim 4, wherein the interpolator further includes a signal derivative estimation module for producing derivative estimates of a data sequence based on the selected sequential sample values output from the tapped delay line.

6. The demodulator of claim 5, wherein the interpolator further includes a clamped cubic spine (CCS) coefficient calculation module for producing coefficient values of the cubic polynomial based on the derivative estimates and buffered ones of the sequential sampled values.

7. The demodulator of claim 6, wherein the interpolator further includes an evaluation module for evaluating the cubic polynomial at fixed interpolation points based on the coefficient values to produce the interpolated digital baseband signal.

8. The demodulator of claim 7, wherein the fixed interpolated points include M binary weighted fractions of each of the coefficient values, and wherein the evaluation module further includes a plurality of multiplexers, each coupled to receive an interpolation point signal and the M binary weighted fractions of one of the coefficient values, wherein each of the multiplexers outputs one of the M binary weighted fractions based on a value of the interpolation point signal.

9. The demodulator of claim 1, wherein the first sampling rate is 3 MHz and the second sampling rate is 12 MHz.

10. The demodulator of claim 1, wherein the lowpass filter is a decimation filter coupled to receive the digital baseband signal at a fourth sampling rate greater than the second sampling rate and produce the filtered digital baseband signal at the first sampling rate.

11. The demodulator of claim 1, wherein the equalizer includes:
a magnitude equalizer coupled to equalize the magnitude of the digital baseband signal to produce a magnitude equalized digital baseband signal; and
a group delay equalizer coupled to equalize the group delay of the magnitude equalized digital baseband signal to produce the adjusted digital baseband signal.

12. The demodulator of claim 11, wherein the magnitude equalizer and the group delay equalizer each comprise one of a Finite Impulse Response (FIR) filter and an Infinite Impulse Response (IIR) filter.

13. The demodulator of claim 11, wherein the magnitude equalizer and the group delay equalizer include one or more biquads connected in series.

14. The demodulator of claim 1, wherein:
the interpolator receives the adjusted digital baseband signal at the first sampling rate at an initial time interpolates the adjusted digital baseband signal to produce the interpolated digital baseband signal at the second sampling rate greater than the first sampling rate over a first time period following the initial time until an optimal sampling point is acquired at a second time corresponding to an end of the first time period and to reduce the sampling rate of the interpolated signal to a third sampling rate less than or equal to the first sampling rate over a second time period following acquisition of the optimal sampling point at the second time; and
the vector de-rotator vector de-rotates the interpolated digital baseband signal at the second sampling rate over the first time period and at the third sampling rate over the second time period to produce the magnitude and phase information.

15. A radio receiver, comprising:
a low noise amplifier for amplifying an inbound radio frequency (RF) signal to produce an amplified inbound RF signal;
a down-conversion module for converting the amplified inbound RF signal to a low intermediate frequency (IF) signal;
an analog-to-digital converter for converting the low IF signal into a digital low IF signal; and
a digital demodulator for converting the digital low IF signal into inbound digital symbols, wherein the digital demodulator includes:
a baseband conversion module for converting the digital low IF signal into a digital baseband signal at a first sampling rate,
a lowpass decimation filter for filtering the digital baseband signal to produce a filtered digital baseband signal at a second sampling rate less than the first sampling rate,
an equalizer operating at the second sampling rate to equalize the frequency response of the digital baseband signal such that the receiver overall in-band frequency response approximates the frequency response of a desired filter to produce an adjusted digital baseband signal,
an interpolator for receiving the adjusted digital baseband signal at the second sampling rate and interpolating the adjusted digital baseband signal to produce an interpolated digital baseband signal at a third sampling rate greater than the second sampling rate and less than the first sampling rate;
a vector de-rotator for vector de-rotating the interpolated digital baseband signal at the third sampling rate to produce magnitude and phase information, and
a demodulation module for producing the inbound digital symbols from the magnitude and phase information;
wherein the interpolator includes a tapped delay line coupled to receive sequential sampled values of the adjusted digital baseband signal and a clock signal at the second sampling rate, wherein the tapped delay line outputs selected ones of the sequential sampled values at each clock of the clock signal;
wherein the tapped delay line includes M delay elements sequentially coupled, each having a respective tap on an output thereof, wherein the tapped delay line further includes a single M×N multiplexer coupled to the tap of each of the M delay elements and coupled to receive a control signal, the multiplexer producing the output of N of the M delay elements based upon a value of the control signal as the selected sequential sampled values.

16. The receiver of claim 15, wherein the first sampling rate is 24 MHz, the second sampling rate is 3 MHz and the third sampling rate is 12 MHz.

17. The receiver of claim 15, wherein the interpolator implements a cubic polynomial that generates interpolated sampled values from sequential sampled values of the adjusted digital baseband signal to produce the interpolated digital baseband signal.

18. The radio receiver of claim 15, wherein:
the interpolator receives the adjusted digital baseband signal at the second sampling rate at an initial time and interpolates the adjusted digital baseband signal to produce the interpolated digital baseband signal at the third sampling rate greater than the second sampling rate and less than the first sampling rate over a first time period following the initial time until an optimal sampling point is acquired at a second time corresponding to an end of the first time period and to reduce the sampling rate of the interpolated signal to a fourth sampling rate less than or equal to the second sampling rate over a second time period following acquisition of the optimal sampling point at the second time; and
the vector de-rotator vector de-rotates the interpolated digital baseband signal at the third sampling rate over the first time period and at the third sampling rate over the second time period to produce the magnitude and phase information.

19. A method for converting a digital baseband signal into inbound digital symbols, the method comprising:
- receiving the digital baseband signal at a first sampling rate;
- filtering the digital baseband signal, the step of filtering producing a filtered digital baseband signal at a second sampling rate, the second sampling rate being less than the first sampling rate;
- equalizing the frequency response of the filtered digital baseband signal such that the overall in-band frequency response approximates the frequency response of a square root raised cosine filter to produce an adjusted digital baseband signal;
- interpolating the adjusted digital baseband signal, the step of interpolating producing an interpolated digital baseband signal at a third sampling rate greater than the second sampling rate and less than the first sampling rate, the step of interpolating comprising:
  - receiving sequential sampled values of the adjusted digital baseband signal and a clock signal at the second sampling rate at a tapped delay line including a single M×N multiplexer and M delay elements sequentially coupled, each having a respective tap on an output thereof that is coupled to the M×N multiplexer;
  - receiving a control signal at the M×N multiplexer; and
  - outputting selected ones of the sequential sampled values at each clock of the clock signal as an output of N of the M delay elements based upon a value of the control signal; and
- demodulating the interpolated digital baseband signal at the third sampling rate to produce the inbound digital symbols.

20. The method of claim 19, wherein the step of interpolating further includes:
- implementing a cubic polynomial that generates interpolated sampled values from sequential sampled values of the adjusted digital baseband signal to produce the interpolated digital baseband signal.

21. The method of claim 19, wherein the interpolating further comprises:
- producing the interpolated digital baseband signal at the third sampling rate greater than the second sampling rate and less than the first sampling rate over a first time period following an initial time until an optimal sampling point is acquired at a second time corresponding to an end of the first time period and reducing the sampling rate of the interpolated signal to a fourth sampling rate less than or equal to the second sampling rate over a second time period following acquisition of the optimal sampling point at the second time; and wherein the demodulating further comprises:
- demodulating the interpolated digital baseband signal at the third sampling rate over the first time period and at the fourth sampling rate over the second time period to produce the inbound digital symbols.

* * * * *